United States Patent
Yang et al.

(10) Patent No.: US 8,765,506 B2
(45) Date of Patent: Jul. 1, 2014

(54) MANUFACTURING METHOD OF LIGHT EMITTING DEVICE

(71) Applicant: Au Optronics Corporation, Hsinchu (TW)

(72) Inventors: Chao-Shun Yang, Taichung (TW); Chen-Ming Hu, Pingtung County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/947,123

(22) Filed: Jul. 22, 2013

(65) Prior Publication Data

US 2013/0309787 A1    Nov. 21, 2013

Related U.S. Application Data

(62) Division of application No. 13/402,882, filed on Feb. 23, 2012, now Pat. No. 8,563,989.

(30) Foreign Application Priority Data

Dec. 15, 2011   (TW) .............................. 100146506 A

(51) Int. Cl.
*H01L 31/0328* (2006.01)
*H01L 31/0336* (2006.01)
*H01L 31/072* (2012.01)
*H01L 31/109* (2006.01)

(52) U.S. Cl.
USPC ............................................. 438/34; 438/46

(58) Field of Classification Search
CPC ........................... H01L 27/1225; H01L 27/32
See application file for complete search history.

(56) References Cited

U.S. PATENT DOCUMENTS

| | | | |
|---|---|---|---|
| 2005/0233532 A1 | 10/2005 | Lenski et al. | |
| 2007/0131926 A1* | 6/2007 | Lee et al. | 257/40 |
| 2008/0135893 A1* | 6/2008 | Park et al. | 257/288 |
| 2011/0114956 A1* | 5/2011 | Park et al. | 257/59 |
| 2013/0119413 A1* | 5/2013 | Harada et al. | 257/88 |

FOREIGN PATENT DOCUMENTS

| | | |
|---|---|---|
| CN | 1661818 | 8/2005 |
| CN | 1961408 | 5/2007 |
| CN | 1971936 | 5/2007 |
| CN | 101667623 | 3/2010 |

OTHER PUBLICATIONS

"Office Action of China Counterpart Application", issued on Apr. 17, 2014, pp. 1-8.

* cited by examiner

*Primary Examiner* — Zandra Smith
*Assistant Examiner* — Pamela E Perkins
(74) *Attorney, Agent, or Firm* — Jianq Chyun IP Office

(57) ABSTRACT

A manufacturing method of a light emitting device is provided. A first electrode is formed on a substrate. The first electrode includes a patterned conductive layer, and the patterned conductive layer includes an alloy containing a first metal and a second metal. An annealing process is performed on the first electrode, so as to form a passivation layer at least on a side surface of the first electrode. The passivation layer includes a compound of the second metal. A light emitting layer is formed on the first electrode. A second electrode is formed on the light emitting layer.

9 Claims, 6 Drawing Sheets

MANUFACTURING METHOD OF LIGHT EMITTING DEVICE

CROSS-REFERENCE TO RELATED APPLICATION

This application is a divisional application of and claims the priority benefit of U.S. application Ser. No. 13/402,882, filed on Feb. 23, 2012, now pending, which claims the priority benefit of Taiwan application serial no. 100146506, filed on Dec. 15, 2011. The entirety of each of the above-mentioned patent applications is hereby incorporated by reference herein and made a part of specification.

BACKGROUND OF THE INVENTION

1. Field of the Invention

The invention relates to a manufacturing method of a device. More particularly, relates to a manufacturing method of a light emitting device.

2. Description of Related Art

An organic electro-luminescence device is characterized by self-luminance, high brightness, high contrast, wide view angle, fast response speed, and so on. Therefore, among various displays, an organic electro-luminescence display (OELD) panel frequently draws attention in the industry. Generally, the OELD panel can be classified into a top emission OELD panel and a bottom emission OELD panel.

Silver or any other metal with high reflectivity is often applied to form an anode in the top emission OELD panel, so as to enhance electro-luminescence intensity. However, a work function of silver is overly low, and thus metal oxide (e.g., indium tin oxide, ITO) with the high work function is often required to form an anode with a stacked structure containing ITO (bottom)/silver (middle)/ITO (top), so as to match the anode with a work function of a hole injection layer in the organic electro-luminescence device. That is to say, in the process of forming the anode, the ITO layer, the silver layer, and the ITO layer need be respectively etched to pattern the anode. It should be mentioned that a sidewall of the silver layer is exposed after the anode is completely etched, and the exposed sidewall of the silver layer is apt to react with a stripper in the subsequent process. Thereby, the exposed sidewall of the silver layer is corroded. Specifically, sulfide in the stripper reacts with silver, and the resultant sulfidization not only leads to the formation of black silver sulfide ($Ag_2S$) around the anode but also continues to damage the anode.

SUMMARY OF THE INVENTION

The invention is directed to a manufacturing method of a light emitting device for forming a passivation layer on a sidewall of an electrode, so as to prevent exposure of the electrode and allow the light emitting device to have favorable device properties.

In this invention, a manufacturing method of a light emitting device is provided. In the manufacturing method, a first electrode is formed on a substrate. The first electrode includes a first patterned conductive layer, and the first patterned conductive layer includes an alloy containing a first metal and a second metal. An annealing process is performed on the first electrode, so as to form a passivation layer at least on a side surface of the first electrode. The passivation layer includes a compound of the second metal. A light emitting layer is formed on the first electrode. A second electrode is formed on the light emitting layer.

Based on the above, in the light emitting device described in an embodiment of the invention, the electrode has a proper work function, thus allowing the light emitting device to have favorable device properties and light emitting intensity. Moreover, in the light emitting device and the manufacturing method thereof, as described in another embodiment of the invention, the passivation layer is formed on the side surface of the electrode, so as to prevent exposure of the electrode. Thereby, the electrode is not damaged, and the light emitting device can thus have favorable device properties.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
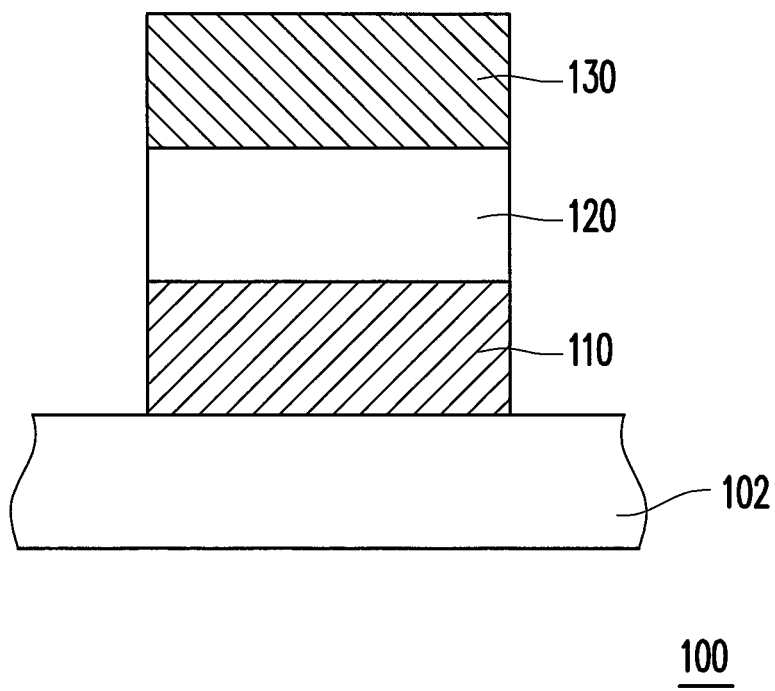
FIG. 1 is a schematic cross-sectional view illustrating a light emitting device according to an embodiment of the invention.

FIG. 1 is a schematic cross-sectional view illustrating a light emitting device according to an embodiment of the invention. With reference to FIG. 1, the light emitting device 100 described in the present embodiment includes a substrate 102, a first electrode 110, a light emitting layer 120, and a second electrode 130. In the present embodiment, the substrate 102 may be a rigid substrate or a flexible substrate. The rigid substrate is, for instance, a glass substrate, a rigid plastic substrate, a metal substrate, a wafer, or a ceramic substrate; the flexible substrate is, for instance, an organic substrate, such as a polyimide (PI) substrate, a polycarbonate (PC) substrate, a polyethylene terephthalate (PET) substrate, a poly(ethylene 2,6-napthalate) (PEN) substrate, a polypropylene (PP) substrate, a polyethylene (PE) substrate, a polystyrene (PS) substrate, any other appropriate substrate, a substrate formed with the above polymer derivates, or a thin metal, thin glass, or thin alloy substrate.

The first electrode 110 is disposed on the substrate 102 and includes an alloy containing a first metal and indium, an alloy containing the first metal and zinc, or an alloy containing the first metal and indium-zinc. Indium, zinc, or indium-zinc accounts for about 0.1 wt %~about 2 wt % of the alloy. According to the present embodiment, indium, zinc, or indium-zinc accounts for about 0.2 wt %~about 1 wt % of the alloy, for instance. The first metal described herein has high reflectivity, such as silver, aluminum, or the like. The alloy containing the first metal and indium, zinc, or indium-zinc is, for instance, silver-indium alloy, aluminum-indium alloy, silver-zinc alloy, aluminum-zinc alloy, silver-indium-zinc alloy, aluminum-indium-zinc alloy, or any other alloy containing indium, zinc, or indium-zinc. Based on actual requirements, the alloy containing the first metal and indium, zinc, or indium-zinc may also include other metal. That is to say, the alloy containing the first metal and indium, zinc, or indium-zinc may substantially include two or more metal elements. Besides, the first electrode 110 in the present embodiment exemplarily has a single-layer structure, while the first electrode 110 in another embodiment may have a multi-layer structure, wherein at least one layer of the multi-layer structure includes the alloy containing the first metal and indium, zinc, or indium-zinc.

The second electrode 130 is disposed on the first electrode 110. The light emitting layer 120 is disposed between the first electrode 110 and the second electrode 130. Here, the light emitting layer 120 may include a red organic light emitting pattern, a green organic light emitting pattern, a blue organic light emitting pattern, a light emitting pattern with other colors, or a combination of the aforesaid light emitting patterns. The second electrode 130 may be made of a transparent conductive material or a non-transparent conductive material, for instance. Besides, the second electrode 130 may have a single-layer structure or a multi-layer structure. The transparent conductive material may include metal oxide, such as indium-tin oxide (ITO), indium-zinc oxide (IZO), aluminum-tin oxide (ATO), aluminum-zinc oxide (AZO), indium-germanium-zinc oxide, other suitable oxide (e.g., zinc oxide), a stacked layer having at least two of the above materials, and a transparent thin metal, e.g., silver or aluminum with the thickness less than about 20 nm. The non-transparent conductive material includes metal, such as silver, aluminum, molybdenum, copper, titanium, or any other appropriate metal. In the present embodiment, the first electrode 110 is the anode, for instance, and the second electrode 130 is the cathode, for instance. However, it should be mentioned that the condition of the first and second electrodes 110 and 120 being respectively the anode and the cathode can be modified based on design requirements. According to an embodiment (not shown), the light emitting device 100 may further include at least one of the hole transporting layer, the hole injection layer, the electron transporting layer, and the electron injection layer, so as to improve the light emitting efficiency of the light emitting device. Here, the hole transporting layer and the hole injection layer are located between the first electrode 110 and the light emitting layer 120, for instance, and the electron transporting layer and the electron injection layer are located between the second electrode 130 and the light emitting layer 120, for instance.

In the light emitting device described in the present embodiment, the electrode includes the alloy containing the first metal and indium, zinc, or indium-zinc, and indium, zinc, or indium-zinc accounts for about 0.1 wt %~about 2 wt % of the alloy. Thus, the electrode suitably serves as the anode of a top emission light emitting device, which should however not be construed as a limitation to the invention. Thereby, the device properties and the light emitting intensity of the light emitting device can be significantly improved. Certainly, based on the required properties of the electrode, indium, zinc, or indium-zinc may also be applied to form another alloy with another metal, so as to form the electrode and further improve the device properties of the light emitting device.

Figure 2A:
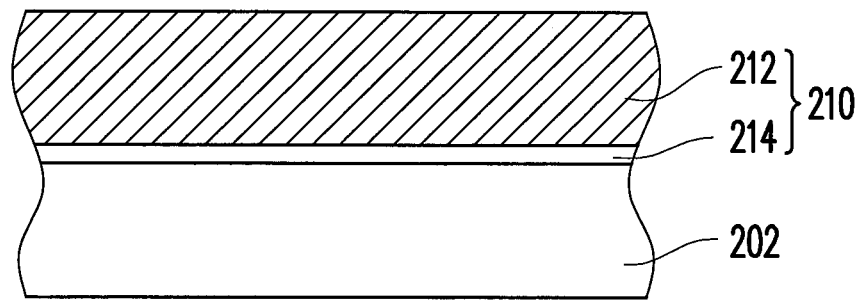
FIG. 2A to FIG. 2E are schematic cross-sectional flow charts illustrating a manufacturing method of a light emitting device according to an embodiment of the invention.

FIG. 2A to FIG. 2E are schematic cross-sectional flow charts illustrating a manufacturing method of a light emitting device according to an embodiment of the invention. With reference to FIG. 2A, a first electrode material layer 210 is formed on a substrate 202. The first electrode material layer 210 includes a first conductive layer 212, and the first conductive layer 212 includes an alloy containing a first metal and a second metal. The first metal described herein has high reflectivity, such as silver, aluminum, or the like. The second metal is indium or zinc, for instance. The alloy containing the first metal and the second metal is silver-indium alloy, aluminum-indium alloy, silver-zinc alloy, aluminum-zinc alloy, or any other alloy, for instance. Namely, the first conductive layer 212 includes silver-indium alloy, aluminum-indium alloy, silver-zinc alloy, aluminum-zinc alloy, or any other alloy, for instance, and the first conductive layer 212 is formed by performing an evaporation process or a sputtering process, for instance. According to this embodiment, the first electrode material layer 210 may further include a second conductive layer 214 located between the substrate 202 and the first conductive layer 212. The second conductive layer 214 described herein is made of indium-tin oxide (ITO), zinc-tin oxide (ZTO), indium-zinc oxide (IZO), other suitable materials and is formed by evaporation, for instance. Based on actual requirements, the alloy containing the first metal and the second metal may include other metal. That is to say, the alloy containing the first metal and the second metal may substantially include two or more metal elements. For instance, in an embodiment of the invention, the alloy containing the first metal and the second metal may be silver-indium-zinc alloy or aluminum-indium-zinc alloy. In another embodiment, it is likely for the first electrode material layer 210 not to include the second conductive layer 214.

Figure 2B:
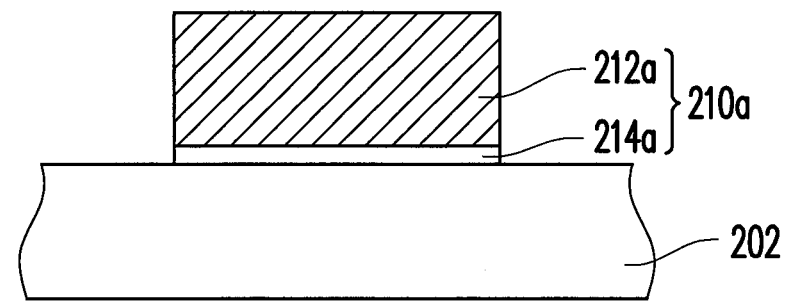

With reference to FIG. 2B, the first electrode material layer 210 is patterned to form a first electrode 210*a*. According to this embodiment, a method of patterning the first electrode material layer 210 includes sequentially patterning the first conductive layer 212 and the second conductive layer 214, for instance. A method of patterning the first conductive layer 212 is, for instance, performing a photolithography and etching process on the first conductive layer 212 according to the present embodiment. If the first conductive layer 212 is exemplarily made of silver-indium alloy, an etchant for etching the first conductive layer 212 may be a mixture of phosphoric acid, nitric acid, and acetic acid, for instance. Besides, a method of patterning the second conductive layer 214 is, for instance, performing a photolithography and etching process on the second conductive layer 214. If the second conductive layer 214 is exemplarily made of ITO, an etchant for etching the second conductive layer 214 may be oxalic acid, for instance.

The first electrode 210*a* includes a first patterned conductive layer 212*a*, and the first patterned conductive layer 212*a* includes an alloy containing the first metal and the second metal. According to this embodiment, the first electrode 210*a* further includes a second patterned conductive layer 214*a*, for instance, and the second patterned conductive layer 214*a* is located between the substrate 202 and the first patterned conductive layer 212*a*. According to the present embodiment, the first electrode 210*a* has a two-layer structure containing ITO/silver-indium alloy, for instance. Notably, the first electrode 210*a* in the present embodiment exemplarily includes the first patterned conductive layer 212*a* and the second patterned conductive layer 214*a*, while the second patterned conductive layer 214*a* may be omitted in another embodiment of the invention. Hence, steps of forming and patterning the second conductive layer 214 can also be omitted.

Figure 2C:
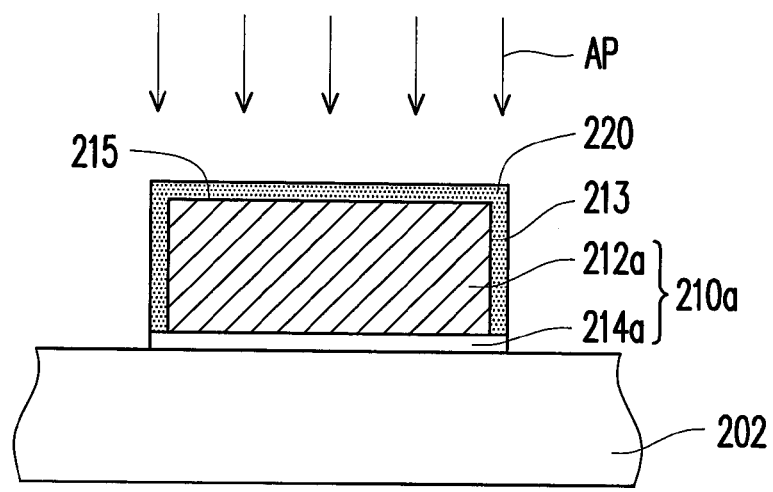

With reference to FIG. 2C, an annealing process AP is performed on the first electrode 210*a*, so as to form a passivation layer 220 at least on a side surface 213 of the first electrode 210*a*. Here, the passivation layer 220 includes a compound of the second metal. Specifically, the second metal is separated from the first patterned conductive layer 212*a* after the annealing process AP is performed, and the second metal may undergo oxidation or other reactions, so as to form a compound of the second metal at least on the side surface 213 of the first electrode 210*a*. In the present embodiment, the second metal is indium or zinc, for instance, and the compound of the second metal formed after performing the annealing process AP is indium oxide ($InO_x$), zinc oxide, or indium-zinc oxide (if the second metal is one of indium and zinc, the other metal is the other one of indium and zinc), for instance. The work function of the compound of the second metal ranges from about 4.8 to about 5.5, for instance. In the present embodiment, the passivation layer 220 includes $InO_x$, zinc oxide, or indium-zinc oxide, for instance. Besides, the passivation layer 220 is formed on the side surface 213 and a top surface 215 of the first patterned conductive layer 212a. The annealing process AP is performed at about 60° C.~about 300° C. for about 10~about 60 minutes, for instance, and gas applied in the annealing process AP is oxygen, nitrogen, a mixture of oxygen and nitrogen, or any other appropriate gas. According to the present embodiment, the annealing process AP is performed at about 250° C. for about 30 minutes, for instance.

Figure 2D:
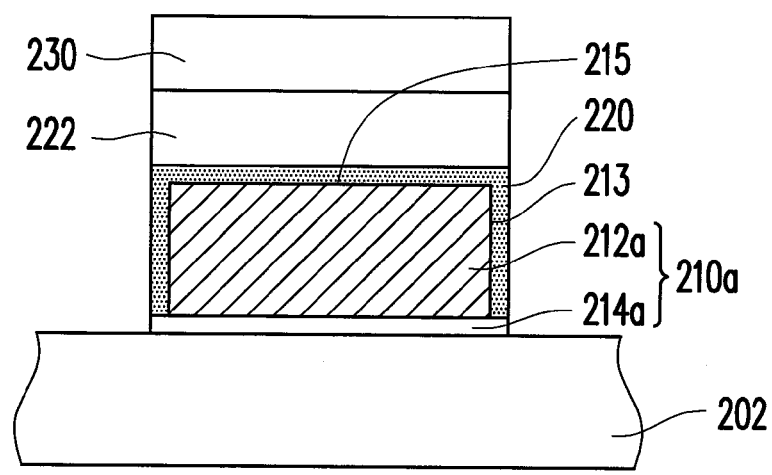

With reference to FIG. 2D, a light emitting layer 230 is formed on the first electrode 210a. According to the present embodiment, the light emitting layer 230 is formed on the passivation layer 220, for instance. Here, the light emitting layer 230 may include a red organic light emitting pattern, a green organic light emitting pattern, a blue organic light emitting pattern, a light emitting pattern with other colors, or a combination of the aforesaid light emitting patterns. Besides, the light emitting layer 230 is formed by vacuum evaporation, for instance. To improve the light emitting efficiency of the light emitting device, a hole transporting layer 222 is further formed between the first electrode 210a and the light emitting layer 230 according to the present embodiment, and the hole transporting layer 222 is formed by vacuum evaporation, for instance. Whether the hole transporting layer 222 is formed may be determined based on actual design demands and should not construed as a limitation to the invention.

Figure 2E:
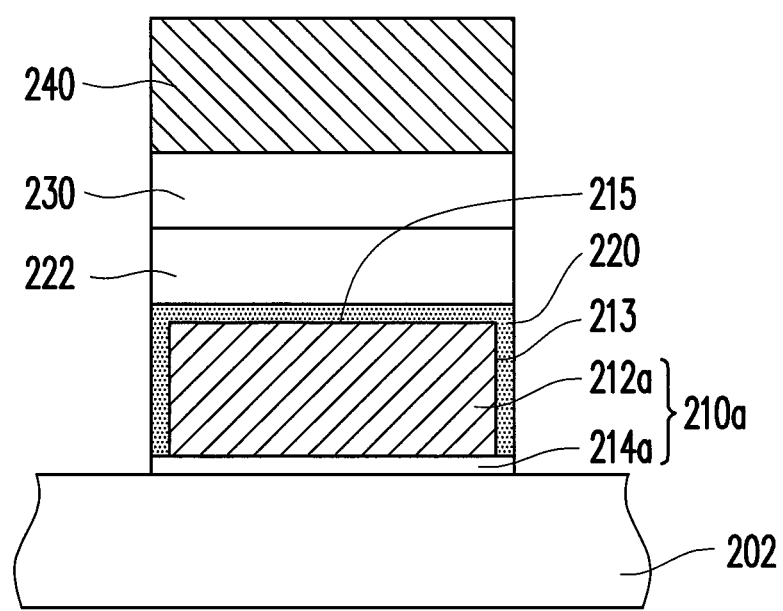

With reference to FIG. 2E, a second electrode 240 is formed on the light emitting layer 230. The material of the second electrode 240 may be referred to as that described in the previous embodiment. Besides, according to an embodiment of the invention, an electron transporting layer, an electron injection layer, or both layers may be further disposed between the second electrode 240 and the light emitting layer 230.

The light emitting device 200 in the present embodiment includes the substrate 202, the first electrode 210a, the passivation layer 220, the light emitting layer 230, and the second electrode 240. The first electrode 210a is disposed on the substrate 202 and includes a first patterned conductive layer 212a. The first patterned conductive layer 212a includes an alloy containing the first metal and the second metal. According to this embodiment, the first electrode 210a further includes a second patterned conductive layer 214a located between the substrate 202 and the first patterned conductive layer 212a. The passivation layer 220 is at least disposed on the side surface 213 of the first electrode 210a and includes the compound of the second metal. Here, the work function of the compound of the second metal ranges from about 4.8 to about 5.5, for instance. In the present embodiment, the passivation layer 220 is further disposed on the top surface 215 of the first electrode 210a. The second electrode 240 is disposed on the first electrode 210a. The light emitting layer 230 is disposed between the first electrode 210a and the second electrode 240. According to the present embodiment, the light emitting device 200 further includes the hole transporting layer 222, for instance.

In the present embodiment, the passivation layer 220 is formed on the side surface 213 and the top surface 215 of the first electrode 210a through performing the annealing process AP on the first electrode 210a. Since the passivation layer 220 located on the side surface 213 of the first electrode 210a prevents the first electrode 210a from being exposed to a stripper or other substance and thus protects the first electrode 210a from being corroded, the first electrode 210a can have favorable device properties and long service life. In addition, the passivation layer 220 located on the top surface 215 of the first electrode 210a provides an interface with the high work function, so as to improve the hole transporting efficiency at the interface between the first electrode 210a and the hole transporting layer 222. Thereby, the light emitting device 200 can be characterized by favorable device properties and light emitting efficiency.

It should be mentioned that three evaporation processes and three patterning processes need to be performed on the material layers in order to form an electrode with a three-layer structure (e.g., ITO(bottom)/silver(middle)/ITO(upper)) according to the related art. Nonetheless, according to the present embodiment, the passivation layer is formed on both the side surface and the top surface of the electrode through performing the annealing process. This not only achieves equivalent effects to those accomplished by the uppermost conductive layer in the conventional electrode but also prevents exposure of the sidewall of the electrode. Namely, at least one evaporation process and one patterning process may be omitted in the present embodiment in comparison with the related art. Hence, the manufacturing method of the light emitting device in the embodiment has simplified manufacturing steps, and the resultant light emitting device is characterized by favorable device properties, satisfactory light emitting efficiency, and long service life.

Figure 3A:
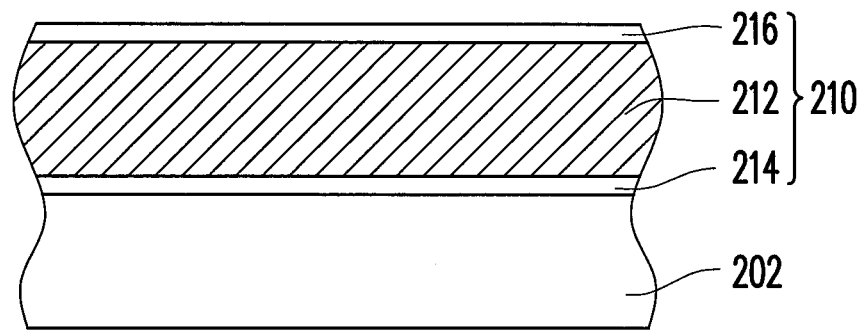
FIG. 3A to FIG. 3D are schematic cross-sectional flow charts illustrating a manufacturing method of a light emitting device according to an embodiment of the invention.

FIG. 3A to FIG. 3D are schematic cross-sectional flow charts illustrating a manufacturing method of a light emitting device according to an embodiment of the invention. The manufacturing method of the light emitting device described in the present embodiment is similar to that of the light emitting device depicted in FIG. 2E, while the difference therebetween mainly lies in the method of forming the first electrode and the passivation layer, which will be elaborated hereinafter. The materials and manufacturing methods of the same components are already described in the previous embodiment and thus will not be reiterated below. With reference to FIG. 3A, a first electrode material layer 210 is formed on a substrate 202. According to this embodiment, the first electrode material layer 210 includes a second conductive layer 214, a first conductive layer 212, and a third conductive layer 216 sequentially disposed on the substrate 202. Note that it is likely for the first electrode material layer 210 not to include the second conductive layer 214 in another embodiment of the invention. The first conductive layer 212 includes an alloy containing a first metal and a second metal. According to the present embodiment, the first conductive layer 212, for instance, includes silver-indium alloy, aluminum-indium alloy, silver-zinc alloy, aluminum-zinc alloy, silver-indium-zinc alloy, aluminum-indium-zinc alloy, or any other alloy. A material of the second conductive layer 214 is ITO, zinc oxide, or zinc-tin oxide, for instance. A material of the third conductive layer 216 is ITO, zinc oxide, or zinc-tin oxide, for instance. The first, second, and third conductive layers 212, 214, and 216 are respectively formed by performing an evaporation process or a sputtering process.

Figure 3B:
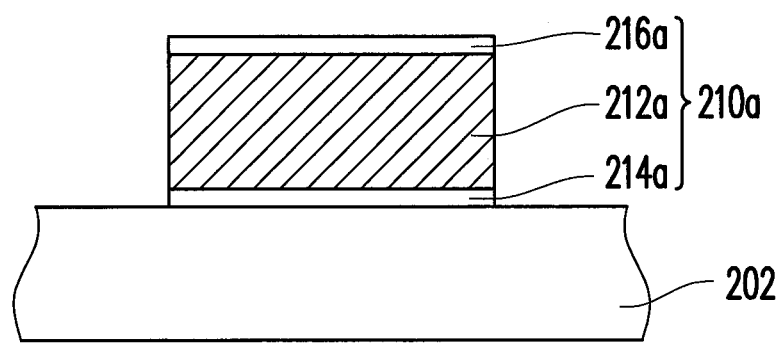

With reference to FIG. 3B, the first electrode material layer 210 is patterned to form a first electrode 210a. According to this embodiment, a method of patterning the first electrode material layer 210 includes sequentially patterning the third conductive layer 216, the first conductive layer 212, and the second conductive layer 214, for instance. The first electrode 210a includes a second patterned conductive layer 214a, a first patterned conductive layer 212a, and a third patterned conductive layer 216a sequentially disposed on the substrate 202. According to the present embodiment, the first electrode 210a has the three-layer structure containing ITO/silver-indium alloy/ITO, for instance.

Figure 3C:
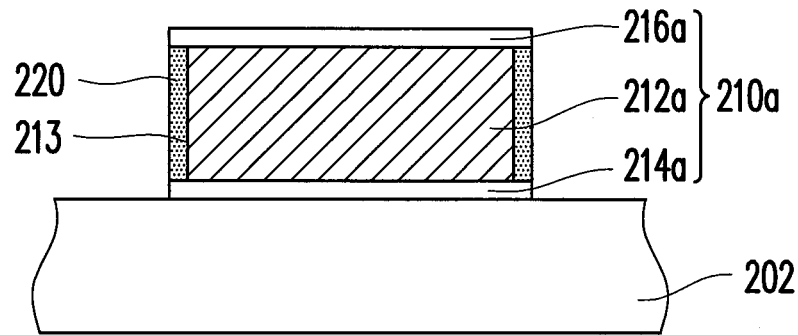

With reference to FIG. 3C, an annealing process AP is performed on the first electrode 210a, so as to form a passivation layer 220 on a side surface 213 of the first electrode 210a. Here, the passivation layer 220 includes a compound of the second metal. A work function of the passivation layer 220 ranges from about 4.8 to about 5.5 in the present embodiment, for instance. The passivation layer 220 includes $InO_x$, zinc oxide, or indium-zinc oxide, for instance. It should be mentioned that the top surface of the first patterned conductive layer 212a is, for instance, covered by the third patterned conductive layer 216a in the present embodiment, and therefore the passivation layer 220 is formed on the exposed side surface 213 of the first patterned conductive layer 212a. Nevertheless, according to an embodiment (not shown), given that the third patterned conductive layer 216a includes reactive metal, the passivation layer 220 may be further formed on the exposed top surface of the third patterned conductive layer 216a.

Figure 3D:
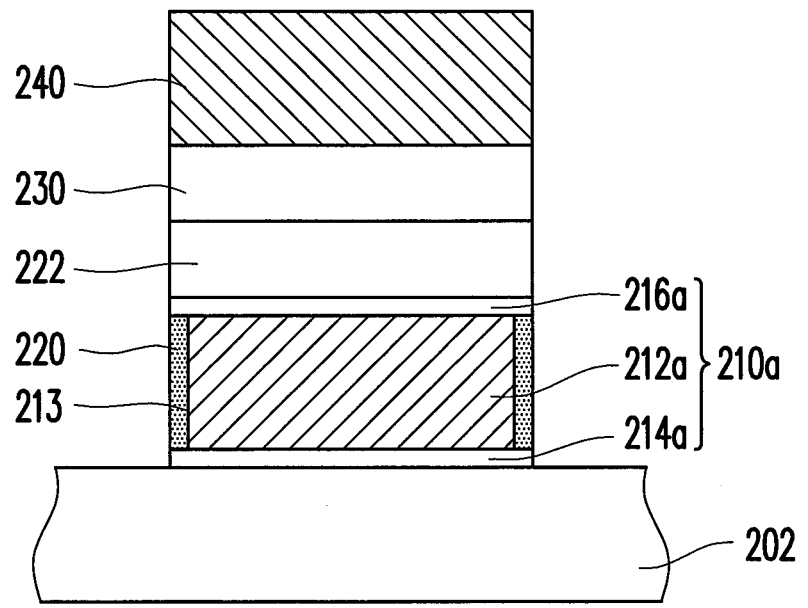

With reference to FIG. 3D, a light emitting layer 230 is formed on the first electrode 210a, and a second electrode 240 is formed on the light emitting layer 230. According to the present embodiment, a hole transporting layer 222 is further formed between the first electrode 210a and the light emitting layer 230. The materials of the light emitting layer 230, the second electrode 240, and the hole transporting layer 222 and the method of forming the same may be referred to as those described in the previous embodiment and thus will not be reiterated herein. Note that the hole transporting layer 222 may be omitted in another embodiment.

In the present embodiment, the first electrode 210a in the light emitting device 200a has a three-layer structure containing the conductive layer 214a/the conductive layer 212a containing alloy/the conductive layer 216a, and the passivation layer 220 is formed on the side surface 213 of the electrode 210a. In addition, the conductive layer 216a disposed in the upper portion of the first electrode 210a provides an interface with the high work function, so as to improve the hole transporting efficiency at the interface between the first electrode 210a and the light emitting layer 230 or the hole transporting layer 222. Since the passivation layer 220 prevents the first electrode 210a from being exposed to a stripper or other substance and thus protects the first electrode 210a from being corroded, the first electrode 210a can have favorable device properties and long service life. Thereby, the light emitting device 200 can be characterized by favorable device properties and light emitting efficiency.

In light of the foregoing, the electrode in the light emitting device described in an embodiment of the invention includes the alloy containing the first metal and indium, zinc, or indium-zinc, and indium, zinc, or indium-zinc accounts for about 0.1 wt %~about 2 wt % of the alloy. Thereby, the device properties and the light emitting intensity of the light emitting device can be significantly improved.

In the light emitting device and the manufacturing method thereof, as described in another embodiment of the invention, the annealing process is performed on the electrode that includes the alloy containing the first metal and the second metal, such that the passivation layer containing the compound of the second metal is formed on the side surface of the electrode. As such, the electrode is not exposed and damaged.

The passivation layer may be further formed on the top surface of the electrode, so as to provide an interface with a proper high work function between the light emitting layer and the electrode and further improve the hole transporting efficiency at the interface between the electrode and another layer. As such, the device properties and the light emitting intensity of the light emitting device can be significantly improved. From another perspective, the manufacturing method of the light emitting device described herein can be easily integrated into the existing manufacturing process in no need of purchasing additional equipment. Accordingly, the manufacturing costs of the light emitting device herein do not significantly increase.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a light emitting device, comprising:
    forming a first electrode on a substrate, the first electrode comprising a first patterned conductive layer, the first patterned conductive layer comprising an alloy containing a first metal and indium, an alloy containing the first metal and zinc, or an alloy containing the first metal and indium-zinc, wherein indium, zinc, or indium-zinc accounts for about 0.1 wt %~about 2 wt % of the alloy;
    performing an annealing process on the first electrode to form a passivation layer at least on a side surface of the first electrode, wherein the passivation layer comprises a compound of indium oxide, zinc oxide, or indium-zinc oxide;
    forming a light emitting layer on the first electrode; and
    forming a second electrode on the light emitting layer.

2. The manufacturing method of the light emitting device of claim 1, wherein the first metal comprises silver or aluminum.

3. The manufacturing method of the light emitting device of claim 1, wherein the first patterned conductive layer comprises silver-indium alloy, aluminum-indium alloy, silver-zinc alloy, aluminum-zinc alloy, or a combination thereof.

4. The manufacturing method of the light emitting device of claim 1, wherein the passivation layer is further formed on a top surface of the first electrode.

5. The manufacturing method of the light emitting device of claim 1, wherein the first electrode further comprises a second patterned conductive layer disposed between the first patterned conductive layer and the substrate.

6. The manufacturing method of the light emitting device of claim 5, wherein the second patterned conductive layer comprises indium-tin oxide, zinc-tin oxide, or indium-zinc oxide.

7. The manufacturing method of the light emitting device of claim 1, wherein the first electrode further comprises a second patterned conductive layer and a third patterned conductive layer, and the first patterned conductive layer is disposed between the second patterned conductive layer and the third patterned conductive layer.

8. The manufacturing method of the light emitting device of claim 7, wherein the second patterned conductive layer and the third patterned conductive layer comprise indium-tin oxide, zinc-tin oxide, or indium-zinc oxide.

9. The manufacturing method of the light emitting device of claim 1, further comprising forming a hole injection layer between the first electrode and the light emitting layer.

* * * * *